(12) United States Patent
Streefkerk et al.

(10) Patent No.: US 8,472,006 B2
(45) Date of Patent: *Jun. 25, 2013

(54) LITHOGRAPHIC APPARATUS AND DEVICE MANUFACTURING METHOD

(75) Inventors: Bob Streefkerk, Tilburg (NL); Johannes Jacobus Matheus Baselmans, Oirschot (NL); Paul Graupner, Aalen (DE); Jan Haisma, Valkenswaard (NL); Nicodemus Hattu, Eindhoven (NL); Christiaan Alexander Hoogendam, Veldhoven (NL); Erik Roelof Loopstra, Eindhoven (NL); Johannes Catharinus Hubertus Mulkens, Waalre (NL); Bernard Gellrich, Aalen (DE)

(73) Assignees: ASML Netherlands B.V., Veldhoven (NL); Carl Zeiss SMT GmbH, Oberkochen (DE)

(*) Notice: Subject to any disclaimer, the term of this patent is extended or adjusted under 35 U.S.C. 154(b) by 550 days.

This patent is subject to a terminal disclaimer.

(21) Appl. No.: 12/463,242

(22) Filed: May 8, 2009

(65) Prior Publication Data

US 2009/0214986 A1    Aug. 27, 2009

Related U.S. Application Data

(63) Continuation of application No. 10/719,683, filed on Nov. 24, 2003, now Pat. No. 7,545,481.

(51) Int. Cl.
*G03B 27/54* (2006.01)
*G03B 27/58* (2006.01)

(52) U.S. Cl.
USPC ................... 355/67; 355/72; 355/75

(58) Field of Classification Search
USPC ............ 355/30, 53, 67, 72, 75; 359/811, 359/819
See application file for complete search history.

(56) References Cited

U.S. PATENT DOCUMENTS

| 3,253,331 | A | * | 5/1966 | Limansky ............... 228/124.1 |
| 3,573,975 | A |   | 4/1971 | Dhaka et al. |
| 3,648,587 | A |   | 3/1972 | Stevens |
| 4,200,794 | A |   | 4/1980 | Newberry et al. |
| 4,346,164 | A |   | 8/1982 | Tabarelli et al. |

(Continued)

FOREIGN PATENT DOCUMENTS

| DD | 206 607 | 2/1984 |
| DD | 221 563 | 4/1985 |

(Continued)

OTHER PUBLICATIONS

Partial translation of DD 206607 published Feb. 1984.*

(Continued)

*Primary Examiner* — Glen Kao
(74) *Attorney, Agent, or Firm* — Pillsbury Winthrop Shaw Pittman LLP

(57) ABSTRACT

The joint between the projection system element and its support comprises an inorganic layer or a direct bond and is thus liquid tight, which can prevent deformation by an immersion liquid. The joint can be made either warm or cold. Solders, glue, and glue protection can all be used in the formation of this joint. In an embodiment, the elements and its support are made of quartz.

15 Claims, 3 Drawing Sheets

U.S. PATENT DOCUMENTS

| | | | |
|---|---|---|---|
| 4,355,323 A * | 10/1982 | Kock | 257/680 |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 4,983,251 A | 1/1991 | Haisma et al. | |
| 5,040,020 A | 8/1991 | Rauschenbach et al. | |
| 5,054,683 A | 10/1991 | Haisma et al. | |
| 5,121,256 A | 6/1992 | Corle et al. | |
| 5,436,766 A | 7/1995 | Leary | |
| 5,488,514 A | 1/1996 | Bruning et al. | |
| 5,610,683 A | 3/1997 | Takahashi | |
| 5,715,039 A | 2/1998 | Fukuda et al. | |
| 5,754,893 A | 5/1998 | Nomura et al. | |
| 5,825,043 A | 10/1998 | Suwa | |
| 5,896,222 A * | 4/1999 | Rosplock et al. | 359/355 |
| 5,900,354 A | 5/1999 | Batchelder | |
| 5,991,101 A | 11/1999 | Holderer et al. | |
| 6,147,817 A * | 11/2000 | Hashizume | 359/819 |
| 6,190,778 B1 | 2/2001 | Batz-Sohn et al. | |
| 6,191,429 B1 | 2/2001 | Suwa | |
| 6,236,634 B1 | 5/2001 | Lee et al. | |
| 6,392,824 B1 | 5/2002 | Holderer et al. | |
| 6,417,974 B1 | 7/2002 | Schuster | |
| 6,448,568 B1 * | 9/2002 | Allen et al. | 250/492.24 |
| 6,556,364 B2 | 4/2003 | Meehan et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,952,253 B2 | 10/2005 | Lof et al. | |
| 6,954,256 B2 | 10/2005 | Flagello et al. | |
| 7,009,682 B2 | 3/2006 | Bleeker | |
| 7,050,146 B2 | 5/2006 | Duineveld et al. | |
| 7,075,616 B2 | 7/2006 | Derksen et al. | |
| 7,081,943 B2 | 7/2006 | Lof et al. | |
| 7,092,069 B2 | 8/2006 | Schuster | |
| 7,193,232 B2 | 3/2007 | Lof et al. | |
| 7,199,858 B2 | 4/2007 | Lof et al. | |
| 7,326,522 B2 | 2/2008 | Dierichs | |
| 7,359,030 B2 | 4/2008 | Simon et al. | |
| 7,394,521 B2 | 7/2008 | Van Santen et al. | |
| 7,545,481 B2 * | 6/2009 | Streefkerk et al. | 355/67 |
| 2001/0055826 A1 | 12/2001 | Chiba | |
| 2002/0020821 A1 | 2/2002 | Van Santen et al. | |
| 2002/0163629 A1 | 11/2002 | Switkes et al. | |
| 2002/0186937 A1 | 12/2002 | LeFlohic | |
| 2003/0123040 A1 | 7/2003 | Almogy | |
| 2003/0174408 A1 | 9/2003 | Rostalski et al. | |
| 2003/0231835 A1 | 12/2003 | Do et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0090607 A1 | 5/2004 | Yoshida | |
| 2004/0109237 A1 | 6/2004 | Epple et al. | |
| 2004/0119954 A1 | 6/2004 | Kawashima et al. | |
| 2004/0125351 A1 | 7/2004 | Krautschik et al. | |
| 2005/0041226 A1 | 2/2005 | Tanaka et al. | |
| 2005/0132914 A1 | 6/2005 | Mulkens et al. | |
| 2006/0050414 A1 | 3/2006 | Harchanko | |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

EP Search Report for EP 02257938 dated Sep. 25, 2003.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

Chinese Office Action for Application No. 200480040835.4 dated May 30, 2008.

PCT Search Report and Written Opinion for PCT Application No. PCT/EP2004/013310, dated Nov. 2, 2005.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

Haisma et al., *Non-Silicon Applications of Direct Bonding*, Philips J. Res. 49, 1995, pp. 151-163.

S. Owa at al., "Update on 193nm immersion exposure tool", Litho Forum, International Sematech, Los Angeles, Jan. 27-29, 2004, Slide Nos, 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65. Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

* cited by examiner

LITHOGRAPHIC APPARATUS AND DEVICE MANUFACTURING METHOD

The present application is a continuation of U.S. patent application Ser. No. 10/719,683, filed Nov. 24, 2003, now allowed, the entire contents of the foregoing application herein fully incorporated by reference.

FIELD

The present invention relates to a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) may mean that there is a large body of liquid that should be accelerated during a scanning exposure. This may require additional or more powerful motors and turbulence in the liquid may lead to undesirable and unpredictable effects. Also, the optical properties, in particular the geometrical optical properties of the elements of the projection system should remain constant.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, in an embodiment along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The presence of fluid around the bottom of a projection system may deform elements of the projection system possibly leading to degradation of exposure. Further, the liquid may enter into the projection system which can damage or deform delicate parts of the apparatus over time.

Accordingly, it would be advantageous to provide, for example, an apparatus in which distortion of the projection system due to the presence of liquid is minimized.

According to an aspect, there is provided a lithographic apparatus comprising:

a support structure configured to hold a patterning device, the patterning device configured to pattern a projection beam with a pattern in its cross-section;

a substrate table configured to hold a substrate; and a projection system configured to project the patterned beam onto a target portion of the substrate, wherein a joint between an element of the projection system and its support comprises an inorganic layer.

By making a joint liquid tight, i.e., no liquid can enter the projection system, deformation of projection system element, such as a lens, may be minimized. In particular, deformation of the element should be limited to the amount by which lens elements can compensate for the distortion.

In an embodiment, the joint can comprise a direct bond. Direct bonding is used as a broad term and encompasses fusion bonding, anodic bonding, compression bonding etc.

The inorganic layer can be a metal, ceramic or glass layer or glue protection. The element of the projection system and its support can be made of glass, bonding of which is relatively simple. In an embodiment, the element and its support are made of fused silica.

The apparatus may further comprise a liquid supply system configured to at least partly fill a space between the projection system and the substrate, with a liquid.

In an embodiment, the joints between all parts of the projection system immersed in liquid comprise an inorganic layer. Liquid can be prevented from entering the projection system or weakening any of the joints. The joint can be made liquid resistant by applying an inorganic layer to the joint.

The joint can be made without any heating. For example, the joint can be made liquid tight by applying a liquid resistant layer to the joint. The joint between the element of the projection system and its support (and other joints) can be made using glue (which need not be liquid resistant) or by the interaction of physically and chemically clean surfaces. To clean the surfaces, a solvent could be applied or the surfaces freshly cleaved. After a bonding, an inorganic layer could then be applied to the joint.

Alternatively, the joint can be heat treated. The joint may be heated to about 900° C., in an embodiment for at least one hour. Again, the joint can be made by the interaction of clean surfaces. For improved results, the glass may be doped with boron. An alternative warm joint is made by the interaction of clean surfaces, sealed with a low temperature glass solder and then heat treated to 600° C. A further type of warm joint is a metal solder. Indium solder has been found to work particularly well.

According to an aspect, there is provided a lithographic apparatus comprising:

a support structure configured to hold a patterning device, the patterning device configured to pattern a projection beam with a pattern in its cross-section;

a substrate table configured to hold a substrate; and a projection system configured to projecting the patterned beam onto a target portion of the substrate, wherein a joint between an of the projection system and its support comprises a direct bond.

According to an aspect, there is provided an immersion projection system manufacturing method comprising joining an element of a projection system, that in use in a lithographic apparatus comes into contact with a liquid, with its support using at least one of an inorganic layer or direct bonding.

According to an aspect, there is provided a device manufacturing method comprising projecting a patterned beam of radiation onto a target portion of the substrate through an element of a projection system joined to its support using at least one of an inorganic layer or direct bonding.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
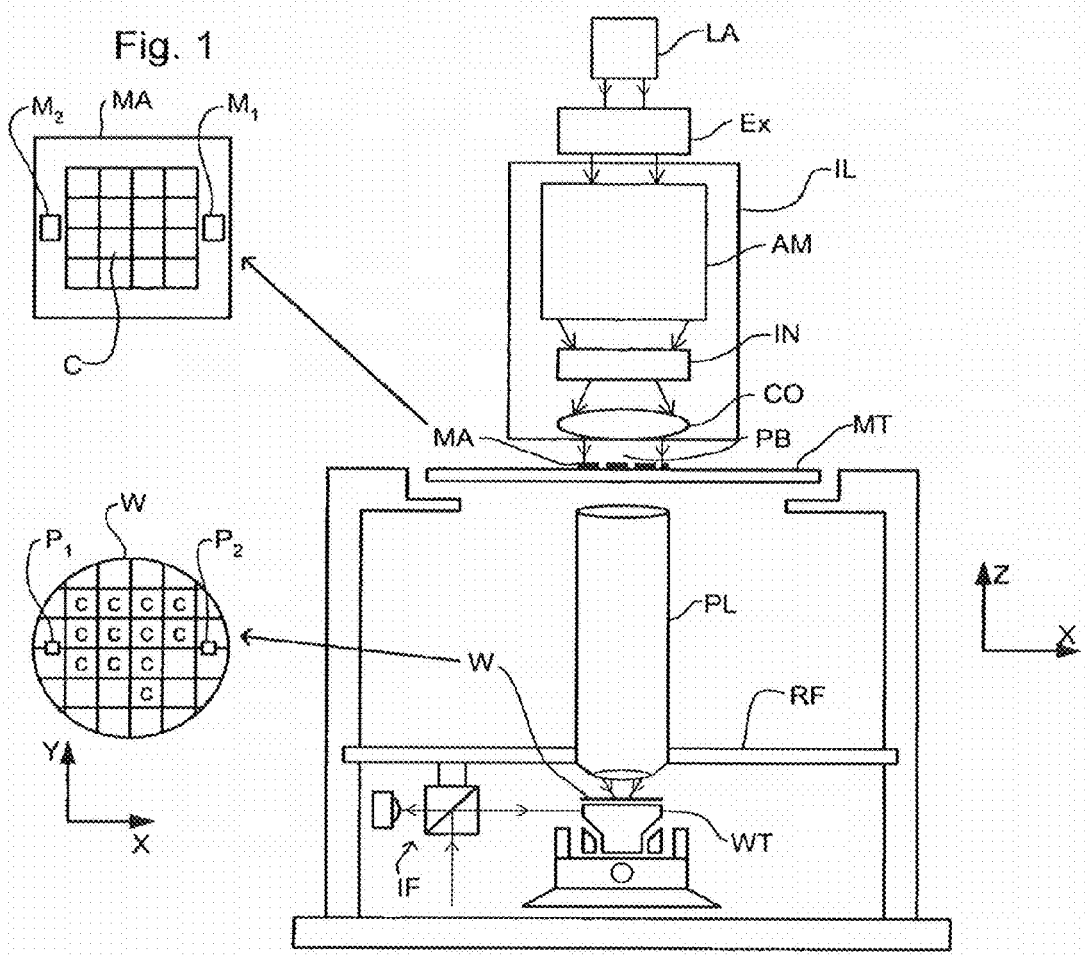
FIG. 1 depicts a lithographic apparatus according to an embodiment of the invention.
Figure 2:
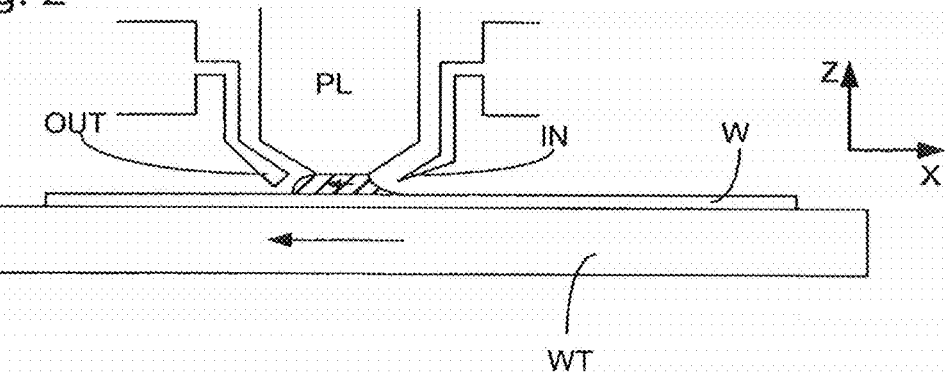
FIG. 2 depicts a liquid supply system according to an embodiment of the invention.
Figure 3:
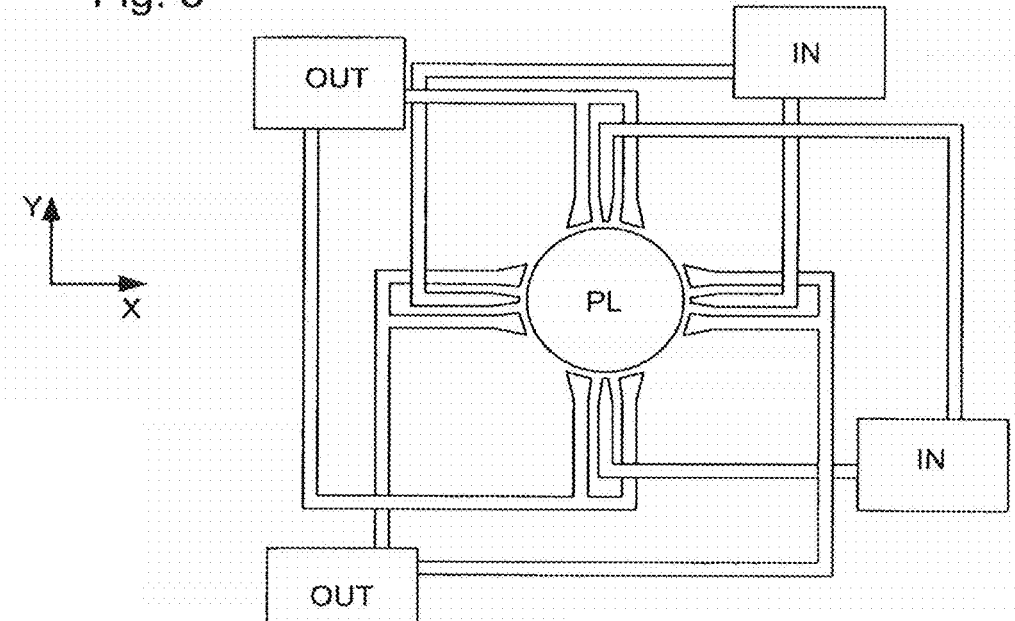
FIG. 3 is an alternative view of the liquid supply system of FIG. 2 according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation);

a first support structure (e.g. a mask table) MT for supporting a patterning device (e.g. a mask) MA and connected to first positioning means for accurately positioning the patterning device with respect to item PL;

a substrate table (e.g. a wafer table) WT for holding a substrate (e.g. a resist-coated wafer) W and connected to second positioning means for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source. The source and the lithographic apparatus may be separate entities, for example when the source is an excimer laser. In such cases, the source is not considered to form part of the lithographic apparatus and the radiation beam is passed from the source to the illuminator IL with the aid of a beam delivery system comprising for example suitable directing mirrors and/or a beam expander. In other cases the source may be integral part of the apparatus, for example when the source is a mercury lamp. The source and the illuminator IL, together with the beam delivery system if required, may be referred to as a radiation system.

The illuminator IL may comprise adjusting means for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning means and position sensor IF (e.g. an interferometric device), the substrate table WT can be moved accurately, e.g. so as to position different target portions C in the path of the beam PB. Similarly, the first positioning means and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In addition to the liquid supply solutions described above, another solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in European Patent Application No. 03252955.4 and U.S. patent application Ser. No. 10/705,783, hereby incorporated in its entirety by reference.

Figure 4:
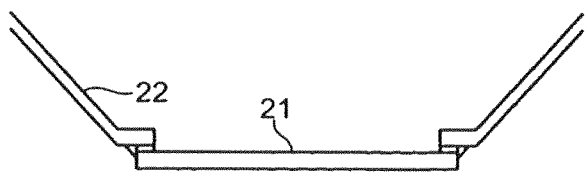
FIG. 4 is a view of a joint according to an embodiment of the invention.
Figure 5:
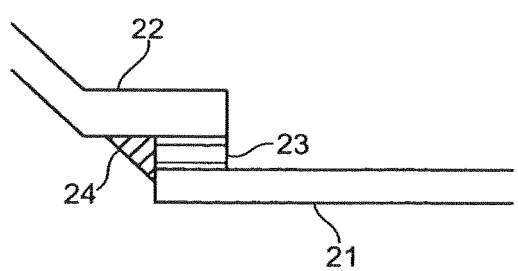
FIG. 5 is a detailed view of the joint shown in FIG. 4.

In FIGS. 4 and 5, the final element, e.g. a lens 21, of the projection system is shown together with its support 22. In this example both the lens 21 and the support 22 are made of fused silica but could be made of another glass or any other transparent material. Indeed the lens 21 and the support 22 need not be made of the same material. Ideally, however, their expansion coefficients should be similar. For example, a higher quality material may be used for the lens 21 and a lower quality material for the support 22. A glue 23 joins the lens 21 and the support 22 together. Once the glue has set a liquid tight layer of glue protection 24 is applied to the joint. The glue protection 24 is applied to the entire joint. No parts are left uncovered.

Figure 6:
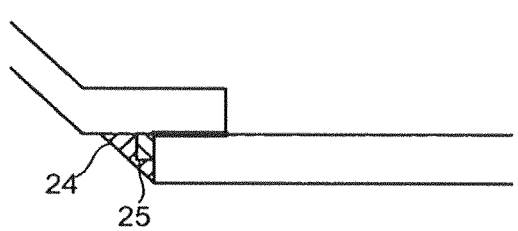
FIG. 6 is a detailed view of an embodiment of the invention.

In FIG. 6, the surfaces of the lens 21 and the support 22 to be joined are smoother and physically and chemically cleaned. The surfaces are so clean and smooth that the molecules in the lens 21 and support 22 begin to interact chemically by so-called "direct bonding", forming a bond between the lens and support. To assist and expedite this process the lens 21 and support 22 can be pressed together for a time. This type of bonding is particularly suitable for this situation as it produces minimal distortion of the original materials, maintains the qualities of the original materials and is strong. Additionally, glue sealing 25 can be applied to the joint followed by glue protection 24 covering the entire of the joint area.

Figure 7:
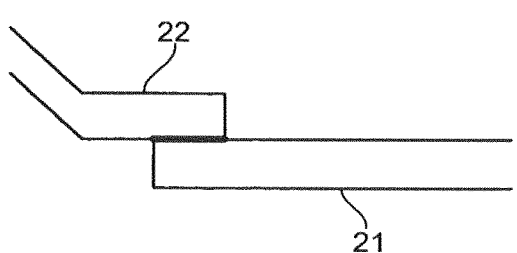
FIG. 7 is a detailed view of a joint according to an embodiment of the invention.

The joint can also be made warm. In FIG. 7, a bond between the lens and support has been made by joining two physically and chemically clean surfaces, as in FIG. 6 and then heat treated at 900° C. for at least one hour, in an embodiment at least six hours. The bonds between the lens 21 and support 22 then become covalent bonds which are particularly strong and watertight, as described in Materials Science Engineering incorporated herein in its entirety. The (glass) lens 21 and/or support 22 can be covered by a thin layer of boron prior to the bonding. The boron diffuses into the lens 21 and/or support 22 where it aids bonding of the molecules concerned and reduces local stresses and strains. Annealing can therefore take place at a lower temperature than if boron were not present and covalent bonds will still be formed. This process is described in more detail in Philips Journal of Research 49 (1995) pages 152-153, incorporated herein in it entirety by reference.

Figure 8:
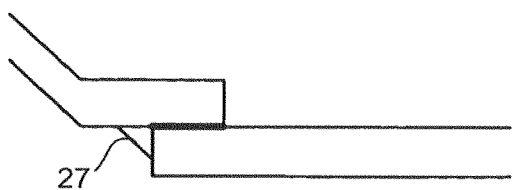
FIG. 8 is a detailed view of a joint according to an embodiment of the invention.

In FIG. 8, the joint has been made by bonding two physically and chemically clean surfaces (as in FIGS. 6 and 7) and then sealed with a low temperature solder 27. The solder should have the same composition as the lens 21 and the support 22. The joint is then heat treated at about 600° C.

Figure 9:
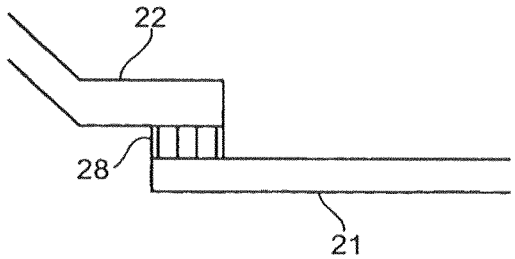
FIG. 9 is a detailed view of a joint according to another embodiment of the invention.

In FIG. 9 an indium solder 28 is used between the lens 21 and the support 22. Although indium is used in an embodiment, other metals can also be used.

Although the joint between the lens 21 and its support 22 has been described here it will be obvious to the skilled person that the same technology can be applied to any other joint in the projection system, and indeed in the lithographic apparatus. In particular, all joints which may come into contact with the immersion liquid should be made liquid tight by one of the methods described above.

While specific embodiments of the invention have been described above, it will be appreciated that the invention may be practiced otherwise than as described. The description is not intended to limit the invention.

The invention claimed is:

1. A lithographic apparatus comprising:
   a substrate table configured to hold a substrate;
   a projection system configured to project a patterned beam of radiation onto a target portion of the substrate; and
   a liquid supply system configured to at least partially fill a space between the projection system and the substrate table, with a liquid,
   wherein a joint between an element of the projection system and its support comprises (i) an inorganic layer and glue protection, the glue protection being applied to protect substantially the entire joint from liquid, or (ii) a direct bond by which molecules of the element and its support chemically interact without using a solder or other material to bond the element to its support, or (iii) both (i) and (ii), and the joint is contacted by liquid when liquid is supplied by the liquid supply system to the space between the projection system and the substrate table.

2. The lithographic apparatus of claim 1, wherein the joint comprises the inorganic layer and glue protection.

3. The lithographic apparatus of claim 2, wherein the inorganic layer comprises indium solder.

4. The lithographic apparatus of claim 1, wherein the joint comprises the direct bond by which molecules of the element and its support chemically interact.

5. The lithographic apparatus of claim 4, wherein the joint further comprises an inorganic layer comprising (i) a metal layer, (ii) a ceramic layer, (iii) a glass layer, or (iv) any combination selected from (i)-(iii).

6. The lithographic apparatus of claim 5, wherein the joint further comprises glue protection.

7. The lithographic apparatus of claim 4, wherein the joint was heat treated to at least 600° C.

8. The lithographic apparatus of claim 1, wherein the element and its support are made of fused silica.

9. A device manufacturing method, comprising:
   projecting a patterned beam of radiation, through a liquid in a space between a projection system and a substrate, onto a target portion of the substrate, wherein a joint between an element of the projection system and its support contacts the liquid and comprises (i) an inorganic layer and glue protection, the glue protection being applied to protect substantially the entire joint from liquid, or (ii) a direct bond by which molecules of the element and its support chemically interact without using a solder or other material to bond the element to its support, or (iii) both (i) and (ii).

10. The method of claim 9, wherein the joint comprises the inorganic layer and glue protection.

11. The method of claim 10, wherein the inorganic layer comprises indium solder.

12. The method of claim 9, wherein the joint comprises the direct bond by which molecules of the element and its support chemically interact.

13. The method of claim 12, wherein the joint further comprises an inorganic layer comprising (i) a metal layer, (ii) a ceramic layer, (iii) a glass layer, or (iv) any combination selected from (i)-(iii).

14. The method of claim 13, wherein the joint further comprises glue protection.

15. The method of claim 12, wherein the joint was heat treated to at least 600° C.

* * * * *